United States Patent [19]

Szepesi et al.

[11] Patent Number: 5,774,021

[45] Date of Patent: Jun. 30, 1998

[54] MERGED TRANSCONDUCTANCE AMPLIFIER

[75] Inventors: Thomas S. Szepesi, Saratoga; Joseph C. Buxton, Palo Alto; Zoltan Zansky, San Carlos; Derek F. Bowers, Sunnyvale, all of Calif.

[73] Assignee: Analog Devices, Inc., Norwood, Mass.

[21] Appl. No.: 725,557

[22] Filed: Oct. 3, 1996

[51] Int. Cl.$^6$ .................................. H03F 3/45; H02J 7/00; G05F 3/26

[52] U.S. Cl. .................... 330/257; 320/145; 320/163; 323/280; 323/285; 323/315; 330/288

[58] Field of Search ...................... 330/257, 261, 330/288; 320/145, 162, 163; 323/280, 285, 315

[56] References Cited

U.S. PATENT DOCUMENTS 4,339,729  7/1982  Jason et al. ....................... 330/288 X
4,585,961  4/1986  Daubert ............................. 330/257 X
5,254,930  10/1993 Daly .................................. 320/145 X

OTHER PUBLICATIONS

Chester Simpson, "Rechargeable Lithium Cells; Power To Burn For Portables", *Electronic Design*, Jun. 27, 1984, pp. 39–44.

Paul Horowitz, Windfield Hill, *The Art of Electronics*, Cambridge University Press, New York, 1989, pp. 242–250, 355–359 and 374.

*Primary Examiner*—James B. Mullins
*Attorney, Agent, or Firm*—Koppel & Jacobs

[57] ABSTRACT

Operational transconductance amplifiers (OTAs) are combined at their outputs, yielding a single frequency compensation connection point. In a preferred embodiment, the output of each OTA is asymmetric, i.e., they can only source current and the OTA outputs are tied together to a constant current sink. Consequently, the OTA that sources more current controls the voltage of the merged output. This merged output point provides a voltage output that may be used as a frequency compensation point.

24 Claims, 4 Drawing Sheets

MERGED TRANSCONDUCTANCE AMPLIFIER

BACKGROUND OF THE INVENTION

1. Field of the Invention

The invention is related to amplifiers and, in particular, to a combination of amplifiers.

2. Description of the Related Art

Amplifiers combined at their outputs provide feedback in many multivariable feedback control systems. One approach to combining amplifiers involves a "diode or" connection at their outputs, which permits either of the amplifiers to drive a connection node. For example, constant current/constant voltage (CCCV) battery chargers employ two amplifiers in a feedback loop: one to compare a battery voltage measurement with a desired value, and one to compare a battery charging current with a desired value, with the amplifier outputs diode"or'ed". Typically, during its constant current phase, a CCCV charger provides a constant, relatively high level, charging current to the battery being charged until a desired battery voltage is reached. At this point, the charger enters its constant voltage phase and attempts to maintain the battery at the desired voltage by supplying a, typically lower level, current: one that may vary, for example, as the battery load varies. One amplifier provides current feedback, the other provides voltage feedback. The amplifier outputs are connected to respective cathodes of a pair of diodes which are joined at their anodes. This junction forms a control terminal and whichever amplifier output is driven to a lower voltage"controls" the terminal by pulling it to within a diode drop of its own voltage. The signal on the control terminal, in turn, controls a current supply circuit which typically includes a voltage regulator that supplies current from a voltage supply to the battery being charged in accordance with the feedback signal thus supplied by the control terminal. The regulator which receives this control signal may be a switching regulator or series regulator, both of which are known. For a more detailed discussion of series and switching regulators, see Paul Horowitz, Winfield Hill, *The Art of Electronics*, Cambridge University Press, New York, 1989, pp 355–357.

Some batteries, Lithium ion batteries in particular, require a rapid transition from constant current to constant voltage charging in order to prevent substantial damage to, or even catastrophic failure of, the battery. A more complete discussion of the issues involving the charging of Lithium ion batteries is included in, Chester Simpson, *Rechargeable Lithium Cells: Power To Burn For Portables*, Electronic Design, Jun. 27, 1994. The requisite rapid transition may be achieved using high gain amplifiers to provide current and voltage feedback. Because the voltage feedback loop is connected to the charger output which has a very large capacitance associated with it, and the current feedback loop generally measures the current through a resistor placed in series with one of the supplies, the loops each require their own frequency compensation circuit. Feedback amplifier frequency compensation is known. For a more detailed discussion see Paul Horowitz, Winfield Hill, *The Art of Electronics*, Cambridge University Press, New York, 1989, pp 242–250.

Briefly, impedances within an amplifier create phase delays, much as a low pass filter, and at some relatively high frequency the closed loop phase delay exceeds 180°. If the amplifier's closed loop gain at this frequency is greater than or equal to one, the desirable negative feedback of the amplifier is converted into positive feedback, and the amplifier will oscillate. In order to keep the amplifier's phase shift below 180° for all frequencies at which the loop gain is greater than unity, sufficient capacitance may be added to that point in the circuit which creates the amplifier's dominant pole, to shift the pole downward in frequency, thereby ensuring that the amplifier's gain is below unity when its phase shift equals 180°. This is known as dominant pole compensation.

Alternatively, a technique known as inverted zero compensation may be employed. Inverted zero compensation is widely used in conjunction with multivariable feedback systems such as CCCV battery chargers and yields a closed loop transfer function of the form:

$$A = G(1+sT)/sT$$

where:
- A=closed loop gain
- G=open loop gain
- T=time constant (RC) of the compensation networks
- s=the complex frequency At low frequencies, this transfer function yields an integrator and at high frequencies, i.e., greater than or equal to the higher loop crossover frequency, it yields a constant gain G. This compensation scheme therefore provides high gain at lower frequencies and no additional phase delay at the crossover frequency.

In integrated circuit implementations of the conventional two-amplifier dual feedback controller, compensation points from each amplifier output are "brought outside" the integrated circuit package by connecting the amplifier out-puts to pins on the integrated circuit package. These pin connections permit those who use the amplifiers to compensate them by adding RC circuits. But packaging issues present very real problems to integrated circuit (IC) designers. Specifically, bringing the amplifier outputs outside the IC package in this fashion may exact a severe penalty, preventing the use of smaller packages due to the limited number of pins available in any standard integrated circuit package. Additionally, any reduction in the number of external components required to compensate the amplifiers would prove extremely beneficial, in terms of cost-savings, increased reliability, and space-savings, to those who employ such amplifiers.

SUMMARY OF THE INVENTION

The invention is directed to a merged amplifier circuit which, in an integrated circuit implementation, reduces the number of pins required to package and frequency compensate the amplifiers. Additionally, the number of components required for frequency compensation may be reduced, in comparison with prior art multiple amplifier configurations.

The invention comprises operational transconductance amplifiers (OTAs) combined at their outputs by commonly driving a current source. (As is customary, the term current source will be used to describe a circuit that may either source or sink a current. That is, the current being sourced may be either positive or negative. The direction of current flow will be clear from the context.) By providing more or less current to the current source, the voltage at the source's high impedance node is modulated by whichever OTA happens to be controlling the output at a given time. The current source's high impedance node provides a single point for frequency compensation and, since this may be brought off-chip in an IC implementation, the design reduces the number of pins required for frequency compensation of multi-amplifier systems.

The merged amplifier is especially suited to applications which employ multiple feedback paths. For example, a constant current/constant voltage (CCCV) battery charger employs two amplifiers: one for current feedback, one for voltage feedback, while charging batteries. Therefore, CCCV chargers would derive particular benefit from the new merged amplifier.

In a preferred embodiment a pre-compensated current source is employed by the new merged amplifier to compensate for the effect of base currents from "shared" current mirrors and differential pairs. By eliminating the base current offsets, the pre-compensated current source eliminates offset voltages which would otherwise appear at the amplifiers' differential inputs.

DETAILED DESCRIPTION OF THE INVENTION

Figure 1:
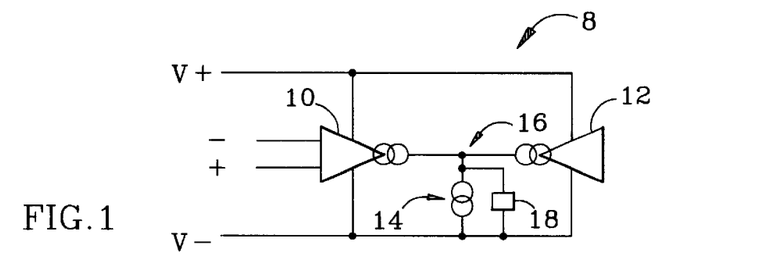
FIG. 1 is a functional level block diagram of the new merged output operational transconductance amplifiers.

The block diagram of FIG. 1 illustrates the major components of the new amplifier combination. Unlike conventional high gain amplifier combinations, such as the diode-or'ed combination sometimes employed in CCCV battery chargers, the new merged amplifiers permit single-point compensation, thereby freeing an integrated circuit package pin for other uses. This pin-savings may allow a multi-amplifier circuit to be packaged in a smaller package than would otherwise be possible. If, for example, a multi-amplifier circuit uses nine pins, including two for compensation, then the circuit may require a ten or twelve pin package. On the other hand, if the same circuit requires only one pin for compensation, it could be packaged within a standard eight pin package. Additionally, the number of external components required to effect compensation may be reduced in comparison with conventional amplifier combinations.

In the examples which follow, a transistor pair may comprise matched NPN transistors with their emitters coupled to the negative supply terminal V−, their bases connected to one another and their collectors coupled to the positive supply terminal V+. Alternatively, n-channel field effect transistors (FETs) could be substituted for the NPN transistors illustrated, or the circuit could be "inverted", using PNP bipolar or P-channel FETs connected to the positive supply terminal to source current to a programming current source (sink) and a load, both of which are coupled to the negative supply V−. All the circuits to be discussed within this specification permit this sort of substitution and inversion. Additionally, the positive and negative supply terminals V+, V− are positive or negative with respect to one another; either one may be below, above, or equal to "ground", for example.

In a first-order analysis, the merged amplifiers 8 include two operational transconductance amplifiers 10,12 combined at their outputs, in a manner which will be described in greater detail in relation to FIG. 2. Each OTA has inverting and noninverting inputs, indicated in the FIG. by (−) and (+), respectively. The amplifiers 10, 12 drive a current source 14 at a high impedance node 16. Excess current directed toward the current source increases the voltage at the high impedance node and, by sourcing more current than the other amplifier, one amplifier can "dominate" the other, thereby controlling the voltage at the high impedance node 16, which may be used as a voltage output. This node also serves as a connection point for a compensation circuit 18 which, as will discussed in relation to FIG. 4, ensures the stability of the amplifiers when they are employed in a closed loop feedback application. Additionally, as will be discussed in relation to FIGS. 3 and 5, feedback circuits associated with the amplifiers will normally provide the greatest measure of control over the switching point of the amplifier 8 and the voltage at the output 16.

Figure 2:
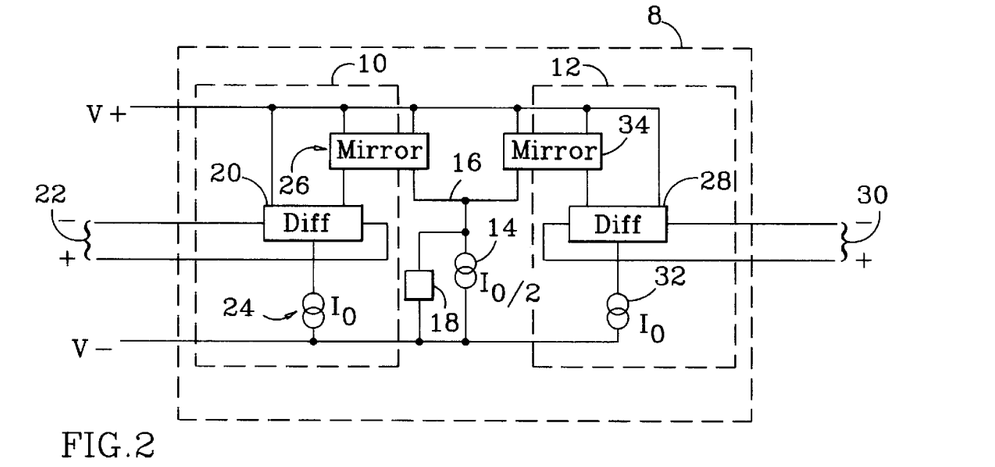
FIG. 2 is a more detailed block diagram of the new merged amplifiers that illustrates their basic components.

The block diagram of FIG. 2 illustrates in greater detail the components of the merged amplifier 8 and includes amplifiers 10 and 12 with merged outputs. The amplifier 10 includes transistors connected as a differential pair 20, the control terminals of the transistors 20 form one differential input port 22. One pair of current conducting terminals from the differential pair 20 is coupled through a current source 24 to a supply terminal, the negative supply terminal V− in this exemplary embodiment. The other current conducting terminals of the pair 20 are coupled to the other supply terminal, the positive supply terminal V+ in this exemplary embodiment. Half of a current mirror 26 is interposed between one of these current conducting terminals and the positive supply terminal V+.

Similarly, the amplifier 12 includes transistors connected as a differential pair 28, the control terminals of the transistors 28 form the other differential input port 30. One pair of current conducting terminals from the differential pair 28 is coupled through a current source 32 to the negative supply terminal V−. The other current conducting terminals of the pair 28 are coupled to the positive supply terminal V+, and half of a current mirror 34 is interposed between one of these current conducting terminals and the positive supply terminal V+.

The remaining halves of the current mirrors 26 and 34 are coupled through a current source 14 to the negative supply terminal. The amplifier 10 includes a differential pair fed by a tail current source 24. The amplifier 10 generates a differential output current in response to a voltage differential across its input port 22. One of the outputs of the differential pair 20 is connected to current mirror 26. The current mirror 26 turns around the current with a 1:1 ratio ad feeds it into the output terminal 16 of the merged amplifier. The other output of the differential pair 20 is tied to the V+ supply terminal. Similarly, the amplifier 12 consists of a differential pair 28 fed by a tail current source 32. The amplifier 12 generate differential output current in response to a differential voltage across its input port 30. One of the outputs of the differential pair 28 is connected to current mirror 34. The current mirror 34 turns around the current with a 1:1 ratio and feeds it into the output terminal 16 of the merged amplifier. The other output of the differential pair 28 is tied to the V+ supply terminal.

To achieve current balance on the merged output 16 the sum of the currents of the two mirrors 26,34 should equal the current of the current source 14. This implies that if one of the amplifiers is in balance, supplying half the Io tail current via its respective current mirror, the other amplifier must be unbalanced, supplying no current by its respective mirror.

In practical battery charger applications one of the amplifiers monitors the difference between the charge current (more precisely, a voltage proportional to the charge current) and a charge current programming voltage, while the other amplifier monitors the difference between the battery voltage and a reference voltage. So long as the battery voltage is much lower than the reference voltage, the merged output is fully controlled by the amplifier that monitors the charge current and the voltage-monitoring amplifier is unbalanced and contributes no charge to the output 16.

As the battery charges up and its voltage approaches the desired voltage, the voltage-monitoring amplifier begins to contribute current to the output 16. Balance can only be maintained if the current contributed by the current-monitoring amplifier is reduced and this only occurs if the charge current is reduced. This reduction in charger current is effected by charge control circuitry, external to the merged amplifier, in response to the rising voltage at the merged output 16. As the battery voltage further approaches the target value, the proportion of current provided by the voltage-monitoring amplifier increases and that provided by the current-monitoring amplifier decreases. As a result the charge current gradually decreases as the battery approaches its target, i.e., full charge. When the battery voltage is at its fully charged level, the voltage-monitoring amplifier is fully balanced, supplying the entire Io/2 current of the source 14, thus forcing the current-monitoring amplifier to be fully unbalanced, thereby turning off the charging current.

It should be noted that in an actual implementation, the amplifiers 10 and 12 will not be perfectly balanced and, aside from short-term transition times, only one of the amplifiers 10,12 will have control at any given time. Whichever amplifier is on will supply all the current to the current source 14 and thereby control the voltage at the terminal 16. External circuitry (not shown in FIG. 2) will determine the point at which the amplifiers switch on and off. For example, as will be described in relation to FIG. 5, in a closed-loop application such as CCCV battery charging the current sensing, voltage sensing and comparison circuitry, which are external to the merged amplifier 8, close feedback loops and determine both the transition point and the voltage at the terminal 16.

Figure 3:
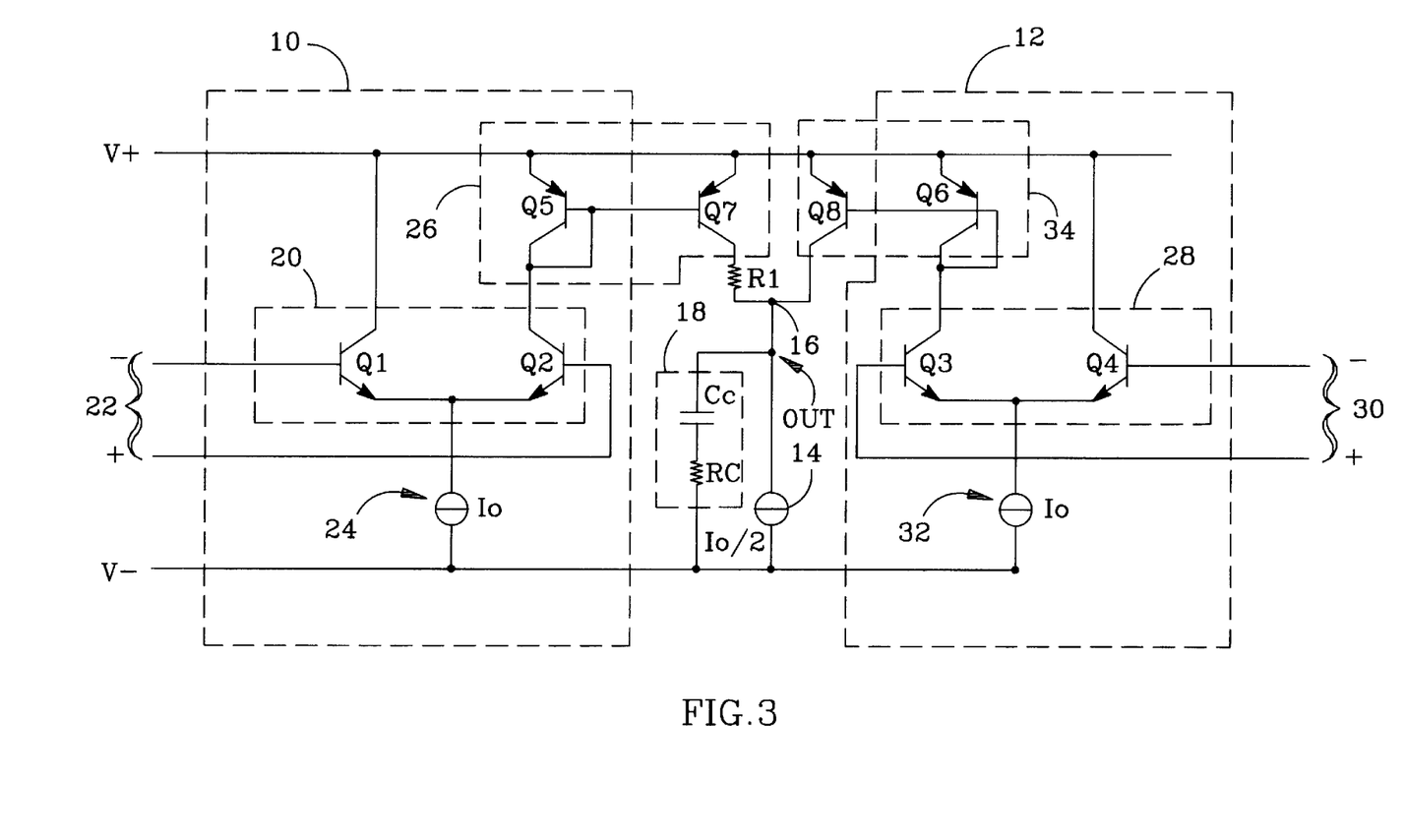
FIG. 3 is a schematic diagram of the merged amplifiers of FIGS. 1 and 2.

The schematic diagram of FIG. 3 illustrates the preferred embodiment of the merged amplifier of FIG. 2. In the following analysis base current imbalances are neglected. In an actual implementation this imbalance may be addressed using known base current compensation techniques. Differential pairs 20 and 28 include matched NPN transistors Q1,Q2 and Q3,Q4, respectively, connected at their emitters and,from their emitters, through respective current sources 24 and 32 to a negative supply terminal V−. The bases of the transistors Q1, Q2, Q3, and Q4 form inverting and noninverting inputs at the respective input ports 22 and 30. The collectors of transistors Q2 and Q3 are connected to the collectors of diode-connected PNP transistors Q5 and Q6, respectively. The emitters of transistors Q5 and Q6 are connected to the positive supply terminal V+.

The emitter areas of PNP transistors Q7 and Q8 match those of transistors Q5 and Q6 and mirror the current through those transistors. That is, the bases of transistors Q5 and Q7 are tied together, as are the bases of transistors Q6 and Q8. Since the emitters of all these transistors are connected to the positive supply terminal V+, the base-emitter voltages of transistors Q5 and Q7 and of transistors Q6 and Q8 will be equal. Consequently, the current through transistor Q7 will equal that through transistor Q5 and that through transistor Q8 will equal that through transistor Q6. The current through transistors Q7 and Q8 is directed toward the current source 14 and, if the total is greater than the prescribed value Io/2, the voltage at the node 16 will increase. Conversely, if the total is less than the prescribed value, the voltage at the node 16 will fall.

Generally, the combined amplifiers will be operated in feedback loops where the sensed parameters are related. As will be described in relation FIG. 5, in a CCCV battery charging application, for example, the current and voltage references will be established so that as the battery being charged reaches the prescribed voltage, current will no longer be sourced from the current-related amplifier and the voltage-related amplifier will begin to supply current to the current source 14, modulating the voltage at the high impedance node 16, as just described.

In this manner, the amplifiers 10, 12 share an output stage that includes transistors Q7 and Q8 and the current source 14. The compensation circuit 18 includes a capacitor Cc coupled from the output node 16 through a resistor Rc to the negative supply terminal V−. In an integrated circuit implementation, the node 16 would be brought "off chip" via a package pin. Additionally, in an application that requires separate frequency compensation circuits for each amplifier, the compensation circuit 18 may be implemented as a parallel combination of RC circuits, that is, one Rc, one Cc for each amplifier, with the capacitors connected to the node 16. Alternatively, a resistor R1 may be placed between one of the current mirrors and the output node 16, as illustrated. The resistor R1 increases the time constant of the compensation network whenever the amplifier 10 dominates, or controls, the output node 16, but has no effect whenever the amplifier 12 controls. In this way, a single external RC circuit, comprising Cc and Rc, provides separate compensation for each amplifier 10,12.

Figure 4:
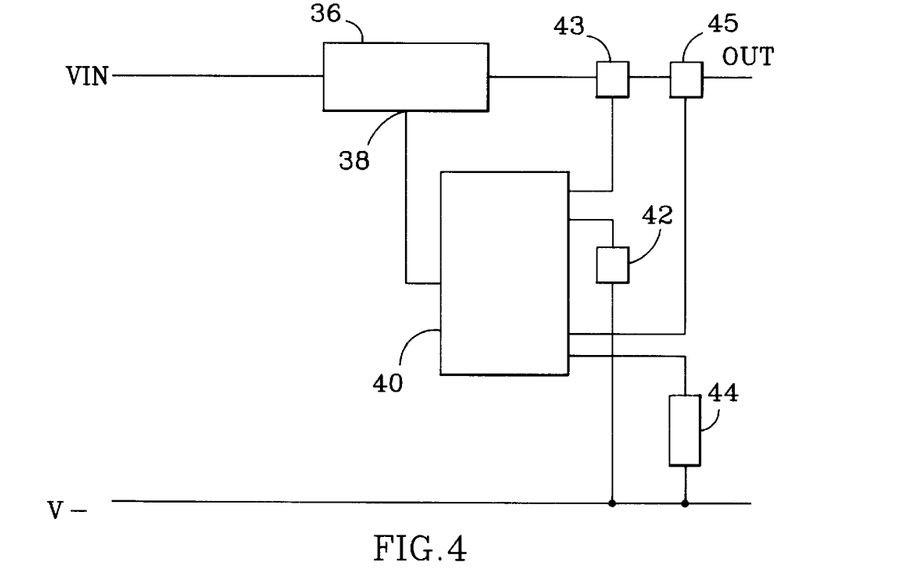
FIG. 4 is a block diagram of a multivariable feedback control system which may employ the new merged amplifiers.

The new merged amplifier is suitable for application in electronic multivariable closed loop feedback control systems such as that illustrated in block diagram form in FIG. 4. Although, for the sake of convenience, the input, output and control signals are voltages in this example, they may, in general, take the form of currents or voltages. A forward loop controller 36 is connected to receive a signal VIN and produces an output signal OUT at terminals having the same labels. Control of the forward loop controller is provided at a control input 38. A measurement and comparison stage 40 is connected to sense at least two aspects of the output signal OUT. References 42 and 44 provide points of comparison for the stage 40, permitting the comparison of the sensed values to target values represented by the references 42 and 44. Based upon these comparisons, the measurement and comparison stage 40 provides a feedback control signal to the control input 38 of the forward loop controller 36. The new merged amplifier 8 may be used, stand alone, as the measurement and control stage 40, or it may be combined with additional circuitry to form the control stage 40. Sensing connections 43 and 45 may be implemented for example as single-point connections for voltage sensing or either one or both may be implemented as a current to voltage converter, e.g., a low valued resistor placed in series between the forward loop controller 36 and the output.

A CCCV battery charger, as discussed in the background section above, is one example of a multivariable feedback control system. A CCCV charger 46 of FIG. 5 employs the new merged amplifier 8 within current and voltage feedback loops to act as the measurement and comparison stage of FIG. 4. In this example, the forward loop controller is a battery-charging circuit which may be based upon a linear voltage regulator or a switching voltage regulator, for example. Such charging circuits are known in the art and are discussed briefly in the background section. Additionally, preferred embodiments will be discussed in greater detail in relation to FIG. 6.

Figure 5:
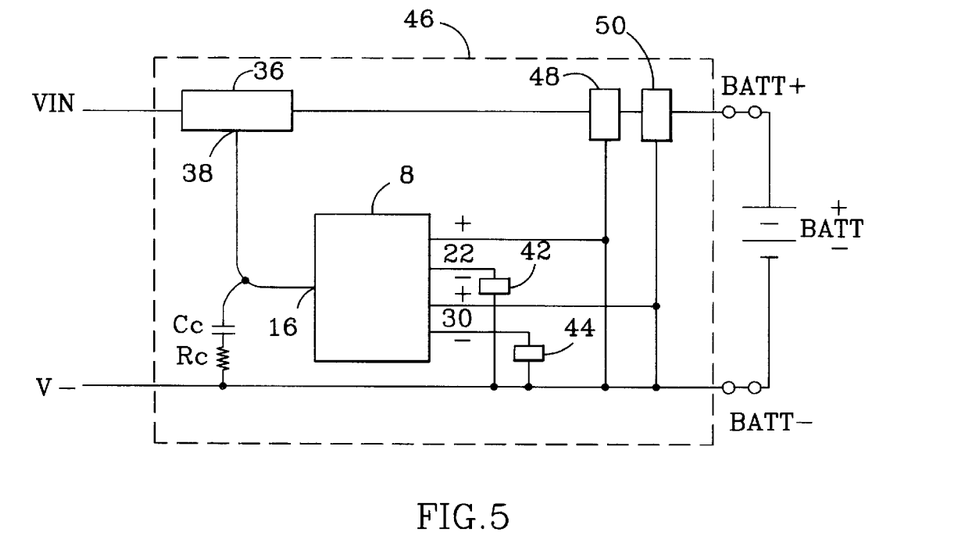
FIG. 5 is a block diagram of a CCCV battery charger that employs the new merged amplifiers.

Briefly, the charging circuit 36 is connected to receive a signal VIN from a power supply and to produce charging current for a battery, labeled BATT, through terminals BATT+ and BATT−. For example, in a linear regulator implementation, the forward loop controller may be implemented as simply a power transistor with one of its current conducting terminals connected to receive VIN, the other connected to supply current to the BATT+ terminal, and its control terminal 38 connected receive a control signal from the merged amplifier's output 16. The control signal determines the amount of charge delivered to a battery connected across the BATT+ and BATT− terminals.

In this charger implementation the references 42 and 44 are connected to the inverting inputs of the input ports 22 and 30, respectively. These ports are as described in relation to FIG. 4. One reference may be derived from another and their ranges may extend to substantially include the input range of the amplifiers 8. A voltage sensing circuit 48 is connected across the BATT+ and BATT− terminals and provides a signal to the noninverting input of the input port 22 which indicates the voltage of an attached battery BATT. Similarly, a current sensing circuit 50 provides an indication of the current flowing into the battery BATT to the noninverting input of the input port 30.

As discussed in the background section, the charger 46 provides a constant, relatively high level current to the battery BATT until a prescribed voltage is reached, then it provides just enough current to maintain the prescribed battery voltage. This means that the amplifier of the merged pair 8 that is connected to compare the battery charging current controls the amplifier output, node 16, as described in relation to FIG. 3, until the prescribed voltage is attained, at which point the amplifiers reverse roles, with the amplifier connected to compare voltage taking control.

This control action may be implemented, for example, by permitting the current-related amplifier to supply all the current to the current source, thereby determining the voltage at the control terminal 16, based upon the desired, high level constant-current charging current. In this example, the charging current is inversely proportional to the control voltages, so that if more than the prescribed current is supplied to the battery, the current-related amplifier increases the amount of current it supplies to the current source 14, thereby increasing the control voltage at the terminal 16 and decreasing the charging current. The charger is controlled in this manner until the prescribed battery voltage is reached, then voltage-related amplifier begins to supply current to the current source 14, further increasing the control voltage and decreasing the charging current supplied to the battery. In this way the current-related amplifier determines the charging current until such time as the battery voltage reaches its prescribed value. Many permutations of this exemplary embodiment may be implemented by varying the sense, i.e., inverting or noninverting, of intermediate signals but, in order to maintain stability, the overall loops must remain negative feedback loops.

Figure 6:
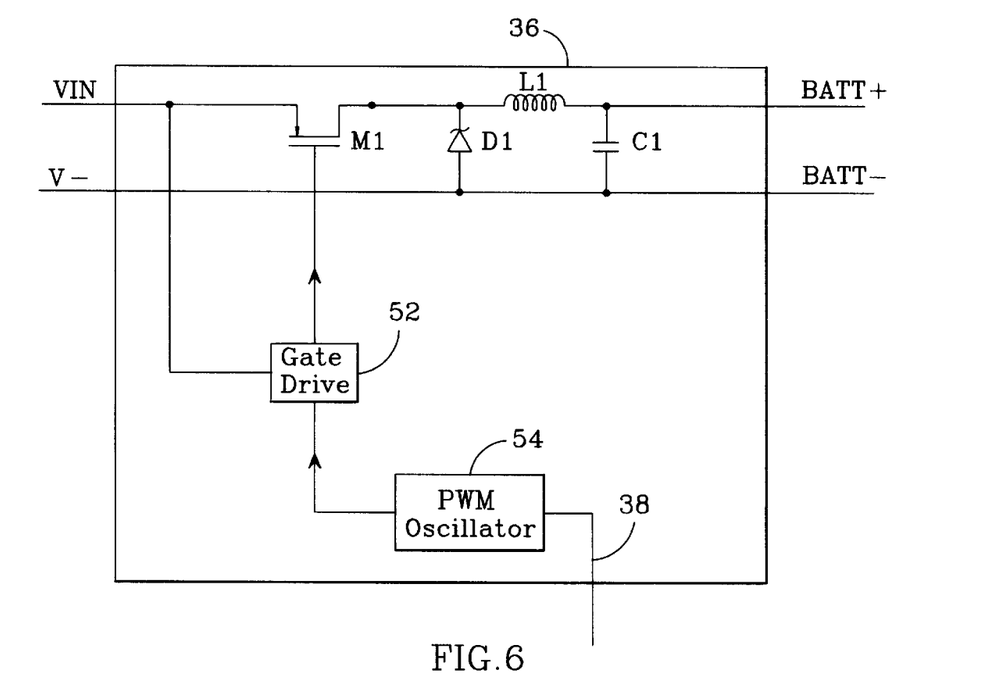
FIG. 6 is a schematic diagram of a switching regulator controller, such as described in relation to the feedback control system of FIG. 4.

As noted in relation to FIG. 4, the new merged amplifiers 8 can also be used in conjunction with a switching regulator to produce a battery charger. Switching regulators are conventional and can be implemented as shown, for example, in Paul Horowitz, Winfield Hill, *The Art of Electronics*, Cambridge University Press, New York, 1989, pages 355–359. FIG. 6 provides a schematic diagram of a switching regulator implementation of the forward loop controller 36. The essential difference between a charger which employs a linear regulator and one based upon a switching regulator is that a linear regulator provides substantially continuous current through a power transistor, whereas a switching regulator regulates the charge flow through the power transistor by switching it on and off.

In the implementation of FIG. 6, a power FET M1 is connected at its source to receive an input voltage VIN and at its gate to receive a control signal from a gate drive circuit 52. The gate drive circuit, in turn, is controlled by a pulse width modulator oscillator 54. The oscillator 54 is connected to receive the control output from the merged amplifier terminal 16. This control output varies at least one pulse characteristic (i.e., pulse width or pulse frequency) of the oscillator 54 in response to the sensed charging current and battery voltage. By varying the oscillator's pulse characteristics, the amplifier 8 varies the charge supplied to an attached battery in accordance with the CCCV charging scheme described in connection with FIG. 5.

That is, current flows through the FET M1 into an inductor L1, charging a capacitor C1 when the FET M1 is "on". A diode D1 acts as a "flywheel", supplying current to the inductor L1 when the FET M1 is switched off. By varying the pulse, the current flowing into the filter capacitor C1 varies, as does the charging current flowing into a battery attached across the BATT+, BATT− terminals, and variation of the pulse is controlled by the output 16, according to the sensed charging current and battery voltage. Alternatively, the forward loop controller may be implemented using a flyback circuit similar to a video flyback circuit, as discussed in Paul Horowitz, Winfield Hill, *The Art of Electronics*, Cambridge University Press, New York, 1989, page 374.

In some applications, notably CCCV charging of Lithium-Ion batteries, tight control of offsets and error components with in the charging circuit is critical to the safety and success of the charger. In the preferred embodiment of FIG. 3 of the novel merged amplifier, the current source 14 includes offset circuitry which minimizes input offset voltages at the amplifier inputs 22,30.

That is, the current mirrors 26, 34 each require base current and that base current is supplied, in the preferred embodiment of FIG. 3, by one leg of each of the differential pairs 20,28. Depending upon whether amplifier 10 or 12 is dominant at the moment, transistor Q2 or Q3 will supply base current to its associated mirror, Q5/Q7 or Q6/Q8, respectively. Since the base-emitter voltage of each of the transistors within the differential pair is a function of the transistor's collector current, this base current difference creates a difference in the differential pairs' base-emitter voltages and this is reflected in an undesirable input offset voltage across the differential inputs 22,30.

The following discussion will apply to either amplifier 10 or 12, whichever one dominates at a given time. Therefore, for the sake of clarity the following discussion will assume that amplifier 10 is dominant and will be limited to a discussion of that amplifier. Assuming the current source 14 produces a current of Io/2, the emitter current of transistor, Q2 will equal Io/2+Io/2βn+Io/βp, where βn and βp are the current gains of the npn and pnp transistors, respectively. The Io/2βn component is simply transistor Q2's base current, and Io/βp is the total base current of the Q5, Q7 current mirror. Since the tail current of the differential pair 20, the total of the transistors Q1 and Q2 emitter currents equals Io, the emitter current of the transistor Q1 must therefore equal Io/2−Io/2βn−Io/βp and the difference between the emitter currents of transistors Q1 and Q2 equals Io/βn+2Io/βp. This difference in current may create a substantial, undesirable, voltage offset at the differential input 22.

Figure 7:
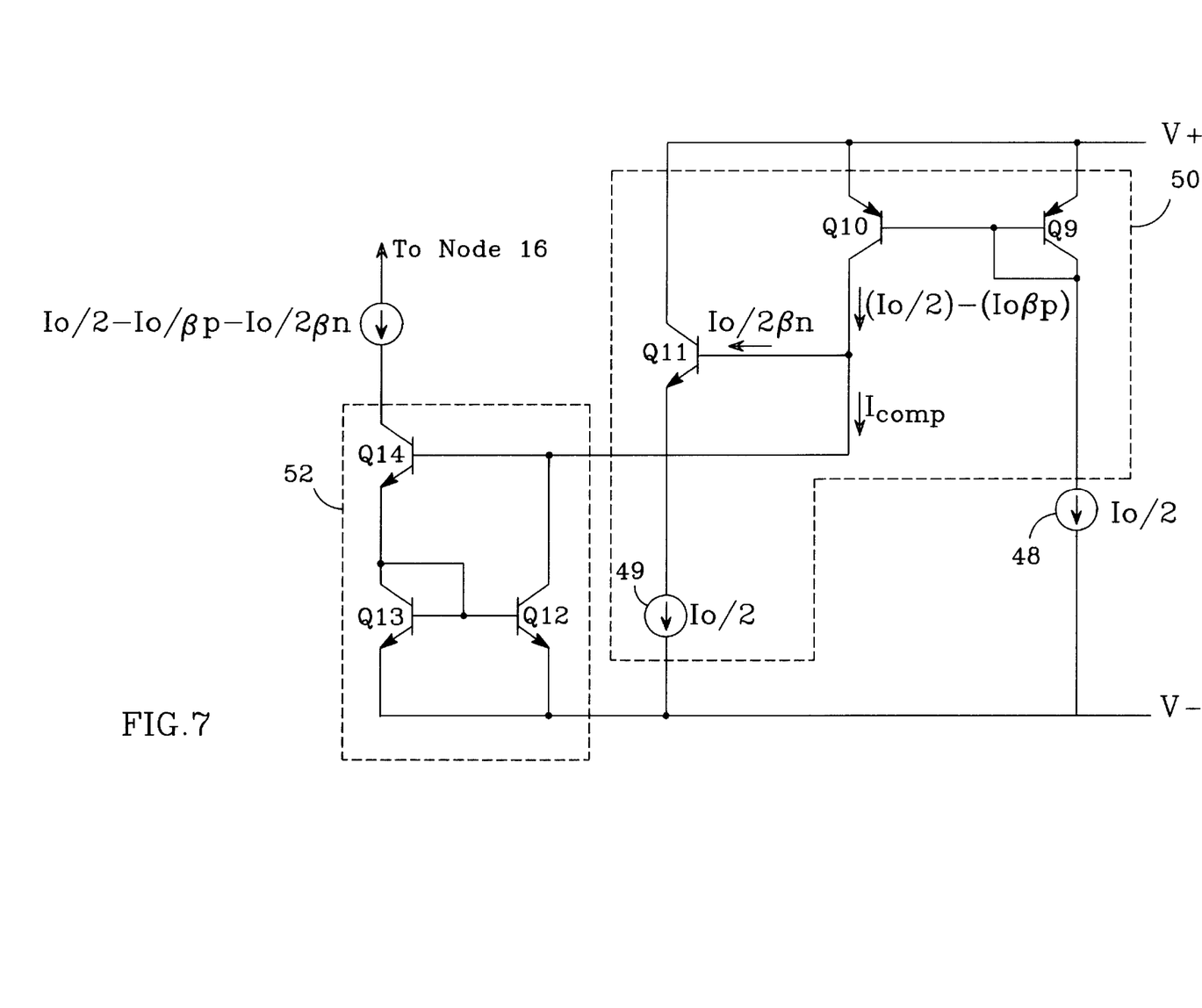
FIG. 7 is a schematic diagram of a preferred pre-compensated current source for use with the merged amplifiers of FIG. 3.

For this reason, the preferred embodiment employs a pre-compensated current source, as illustrated in FIG. 7, which produces an output current equal to Io/2−Io/2βn−Io/βp. Neglecting second-order effects, with this current as its input, the output of the current mirror 26, i.e., the collector current of transistor Q2, is given by:

$$Io/2-Io/2\beta n-Io/\beta p+Io/\beta p=Io/2-Io/2\beta n$$

and the emitter current of transistor Q2 is given by:

$$Io/2-Io/2\beta n+Io/2\beta n=Io/2$$

which yields a balanced differential pair with negligible input offset voltage.

The pre-compensated current source 14 of FIG. 7 includes a current source 48 connected to sink a current equal to the desired current, i.e., Io/2, from a base current complementor 50. The base current complementor 50 produces a current equal to the complement of the base currents contributed to the emitter current of transistor Q2 in FIG. 3. That is, as noted above, the mirror 26 adds a base current component equal to Io/βp and the transistor Q2 adds a base current component equal to Io/2βn, yielding a total contribution of Io/βp+Io/2βn. The base current complementor subtracts an equal amount of current, i.e., Io/βp+Io/2βn, from the Io/2 current source to provide a compensated output current Icomp which equals Io−Io/βp−Io/2βn.

The complementor 50 includes a current mirror which includes pnp transistors Q9 and Q10, each of which exhibit the same current gain as the transistors of the mirrors 26 and 34. Transistor Q9 is diode-connected to supply Io/2 to the current source 48. The bases of transistors Q9 and Q10 are connected to one another and to the collector of transistor Q9. Therefore, transistor Q10 mirrors a current equal to Io/2−Io/βp. An npn transistor Q11 having the same current gain as the transistors of the differential pairs 20 and 28 is connected a current source 49 which establishes an emitter current of Io/2 in the transistor Q11. The base of transistor Q11 is connected to the collector of transistor Q10 and thereby diverts its base current, equal to Io/2βn, from the collector current of transistor Q10, yielding the base current compensated output current Icomp.

A stable current mirror 52, such as the illustrated Wilson mirror, is connected to mirror the compensated current Icomp. Matched npn transistors Q12 and Q13 are connected to mirror the collector current of transistor Q12, Icomp, through the conducting terminals of another npn transistor Q14. Transistor Q14 holds the collector of transistor Q12 at two diode drops above the negative supply terminal, thus circumventing the Early effect and providing a stable output current. The collector current of transistor Q14 is, therefore, equal to Icomp (Io−Io/βp−Io/2βn) and, in the preferred embodiment of FIG. 3, the collector of transistor Q14 is connected to the high impedance node 16.

The forgoing description of specific embodiments of the invention has been presented for the purposes of illustration and description. It is not intended to be exhaustive or to limit the invention to the precise forms disclosed, and many modifications and variations are possible in light of the above teachings. For example, bipolar transistors of one type may be interchanged with one another, e.g., NPN with PNP and vice versa, with appropriate corresponding supply polarity changes, and FETs of the proper polarity may be substituted for the bipolar transistors illustrated. Although only two amplifiers are shown in the drawings, additional amplifiers may be combined in the fashion illustrated, with the current source at the output stage operating at one half the tail current of each of the amplifiers. The embodiments were chosen and described in order to best explain the principles of the invention and its practical application, to thereby enable others skilled in the art to best utilize the invention. It is intended that the scope of the invention be limited only by the claims appended hereto.

We claim:

1. Merged amplifiers, comprising:
   a plurality of operational transconductance amplifiers, each having differential inputs and current outputs, the outputs of said amplifiers connected to share an output stage, and
   a current source having a high impedance node coupled to said output stage to thereby be modulated in voltage at said high impedance node by said output stage, thereby producing a voltage output.

2. The merged amplifiers of claim 1, wherein each operational transconductance amplifier comprises:
   a differential pair of transistors, with the control terminal of each transistor forming one of said differential inputs,
   a diode coupled between one of said transistors in each differential pair and a supply terminal, and
   current mirroring transistors connected to mirror the current through each said diode and to thereby drive said high impedance node.

3. Merged amplifiers, comprising:
   a plurality of operational transconductance amplifiers, each having differential inputs and current outputs, the outputs of said amplifiers connected to share an output stage,
   a current source coupled to said output stage to thereby be modulated in voltage at a high impedance node by said output stage, thereby producing a voltage output, each of said operational transconductance amplifiers comprising:
      a differential pair of transistors, with the control terminal of each transistor forming one of said differential inputs,
      a diode coupled between one of said transistors in each differential pair and a supply terminal, and
      current mirroring transistors connected to mirror the current through each said diode and to thereby drive said high impedance node, and
   a compensation network connected between said high impedance node and a supply terminal, said compensation network producing poles and zeroes at the appropriate frequency for each of said amplifiers.

4. Merged operational transconductance amplifiers, comprising:
   first and second bipolar differential pairs, the control terminals of said pairs providing differential inputs, one set of current conducting terminals of the first pair coupled through a first current source to a supply terminal, a corresponding set of current conducting terminals of the second differential pair coupled through a second current source to said supply terminal, the other set of current conducting terminals of the first and second pair coupled to another supply terminal, a third current source having a high impedance node, and first and second current mirrors connected to mirror current from said first and second differential pairs, respectively, into said third current source at said high impedance node, forming a voltage output at said node.

5. Merged operational transconductance amplifiers, comprising:

first and second bipolar differential pairs, the control terminals of said pairs providing differential inputs, one set of current conducting terminals of the first pair coupled through a first current source to a supply terminal, a corresponding set of current conducting terminals of the second differential pair coupled through a second current source to said supply terminal, the other set of current conducting terminals of the first and second pair coupled to another supply terminal, a third current source, first and second current mirrors connected to mirror current from said first and second differential pairs, respectively, into said third current source at a high impedance node, forming a voltage output at said node, and a compensation network connected from said node to a supply terminal, said network producing poles and zeroes at the appropriate frequency for feedback loops to which said amplifiers are connectable.

6. The merged amplifiers of claim 5, wherein said compensation network comprises:

a resistor interposed between said high impedance node and one of said current mirrors, and an RC circuit, connected between said node and a supply terminal, said RC circuit providing two different zeroes, one in combination with the resistor, the other without.

7. A multivariable closed loop electronic control system, comprising:

a forward loop controller connected to receive an input signal and a control signal and to provide an output signal, and a measurement and comparison stage connected to measure parameters of the output signal, to compare those measurements with desired values, and to provide a control signal to said forward loop controller based upon those measurements and comparisons, said measurement and comparison stage comprising:

merged transconductance amplifiers having differential inputs and current outputs, the outputs of said amplifiers connected to share an output stage, and a current source coupled to said output stage to thereby be modulated in voltage at a high impedance node by said output stage, thereby producing a voltage output, said voltage output connected to said control input and said differential inputs of each transconductance amplifier connected to measure and compare one of said parameters apiece.

8. The control system of claim 7, wherein each transconductance amplifier comprises:

a differential pair of transistors, with the control terminal of each transistor forming one of said input terminals, a diode coupled between one of said transistors in each differential pair and a supply terminal, and current mirroring transistors connected to mirror the current through each said diode and to thereby drive said high impedance node.

9. A constant current/constant voltage battery charger, comprising:

a battery charging controller having an input terminal for connection to a voltage supply terminal, a charging output terminal for connection to a battery to thereby supply a controlled charging current to said battery, and a control input terminal for connection to a measurement and comparison system, said control input terminal providing feedback to said charging controller, and a measurement and comparison circuit including a pair of merged operational transconductance amplifiers, the outputs of said amplifiers connected to share an output stage, said measurement and comparison circuit connected to measure the voltage across a battery under charge and the charging current supplied to said battery, to compare those values to desired values and to produce a control signal based upon those measurements and comparisons and to provide said control signal to said control input terminal.

10. A constant current/constant voltage battery charger, comprising:

a battery charging controller having an input terminal for connection to a voltage supply terminal, a charging output terminal for connection to a battery to thereby supply a controlled charging current to said battery, and a control input terminal for connection to a measurement and comparison system, said control input terminal providing feedback to said charging controller, and a measurement and comparison circuit including a pair of merged operational transconductance amplifiers, said measurement and comparison circuit connected to measure the voltage across a battery under charge and the charging current supplied to said battery, to compare those values to desired values and to produce a feedback control signal based upon those measurements and comparisons and to provide said control signal to said control input terminal, wherein said pair of merged operational transconductance amplifiers comprise:

first and second bipolar differential pairs, the control terminals of said pairs providing differential inputs, one set of current conducting terminals of the first pair coupled through a first current source to a supply terminal, a corresponding set of current conducting terminals of the second differential pair coupled through a second current source to said supply terminal, the other set of current conducting terminals of the first and second pair coupled to another supply terminal, a third current source, and first and second current mirrors connected to mirror current from said first and second differential pairs, respectively, into said third current source at a high impedance node, forming a voltage output at said node.

11. The charger of claim 10, wherein said controller comprises:

a linear voltage regulator controller including a series element having a control input and two current conducting terminals, one of said conducting terminals connectable to said voltage input, the other of said conducting terminals connectable to said charging output terminal and said control input connected to receive said feedback control signal from said measurement and comparison circuit to thereby supply charging current in accordance with said control input.

12. The charger of claim 10, wherein said controller comprises:
   a switching voltage regulator controller including a switching element control terminal, and
   an oscillator connected to receive said feedback control signal from said measurement and comparison circuit and to supply an oscillating control signal to said switching element, the oscillatory characteristics of which are responsive to said feedback control signal.

13. The charger of claim 12, wherein pulse-width is one of said oscillatory characteristics responsive to said feedback control signal.

14. The charger of claim 12, wherein pulse-frequency is one of said oscillatory characteristics responsive to said feedback control signal.

15. A pre-compensated current source, comprising:
   a first current source connected to produce a desired current,
   a base current complementor connected to said current source and arranged to produce a compensation current which is equal to the desired current minus a current equal to the sum of predetermined base currents, and
   a current mirror connected to mirror the compensation current produced by said base current complementor, said mirrored current connected to compensate said predetermined base currents.

16. The pre-compensated current source of claim 15, wherein said current mirror is a Wilson current mirror.

17. The pre-compensated current source of claim 15, wherein said base current complementor comprises:
   a current mirror connected to subtract its own base current from the desired current produced by said current source and to mirror the resultant current,
   a second current source arranged to produce said desired current, and
   a bipolar transistor connected to said second current source and arranged to obtain base current from the mirrored current and to subtract current equal to the desired current divided by the current gain of the bipolar transistor, said mirrored current minus said current equal to the desired current divided by the current gain of the bipolar transistor being said compensation current.

18. Merged operational transconductance amplifiers, comprising:
   first and second bipolar differential pairs, the control terminals of said pairs providing differential inputs, one set of current conducting terminals of the first pair coupled through a first current source to a supply terminal, a corresponding set of current conducting terminals of the second differential pair coupled through a second current source to said supply terminal, the other set of current conducting terminals of the first and second pair coupled to another supply terminal,
   a pre-compensated current source,
   said pre-compensated current source comprising:
      a third current source connected to produce a current equal to one half that of the first and second current sources,
      a base current complementor connected to produce a complementary base current which is equal to the complement of predetermined base currents and to combine the complementary base current with the current produced by the third current source, and
      an output current mirror connected to mirror the combined current produced by the base current complementor and to thereby form a pre-compensated output current, and
   first and second current mirrors connected to mirror current from said first and second differential pairs, respectively, into said third current source at a high impedance node, forming a voltage output at said node.

19. The merged amplifiers of claim 18, wherein said output current mirror is a Wilson current mirror.

20. The merged amplifiers of claim 19, wherein said base complementor comprises:
   a third current mirror connected to subtract its own base current, which equals the base current required for said first and second current mirrors, from the desired current produced by said third current source and to mirror the resultant current, and
   a bipolar transistor, having a current gain equal to the current gain of the transistors of the differential pairs, connected to obtain base current from the current mirrored by said third current mirror and to thereby subtract current equal to one half that of the first and second current sources divided by the current gain of the bipolar transistor.

21. A multivariable closed loop electronic control system, comprising:
   a forward loop controller connected to receive an input signal and a control signal and to provide an output signal, and
   a measurement and comparison stage connected to measure parameters of the output signal, to compare those measurements with desired values, and to provide a control signal to said forward loop controller based upon those measurements and comparisons, said measurement and comparison stage comprising:
      merged transconductance amplifiers having differential inputs and current outputs, the outputs of said amplifiers connected to share an output stage, and
      a pre-compensated current source coupled to said output stage to thereby be modulated in voltage at a high impedance node by said output stage, thereby producing a voltage output, said voltage output connected to said control input and said differential inputs of each transconductance amplifier connected to measure and compare one of said parameters apiece, said merged transconductance amplifiers comprising:
         first and second bipolar differential pairs, the control terminals of said pairs providing differential inputs, one set of current conducting terminals of the first pair coupled through a first current source to a supply terminal, a corresponding set of current conducting terminals of the second differential pair coupled through a second current source to said supply terminal, the other set of current conducting terminals of the first and second pair coupled to another supply terminal, said pre-compensated current source comprising:
            a third current source connected to produce a current equal to one half that of the first and second current sources,
            a base current complementor connected to produce a complementary base current which is equal to the complement of predetermined base currents and to combine the complementary base current with the current produced by the third current source, and an output current mirror connected to mirror the combined current produced by the base current complementor and to thereby form a pre-compensated output current, and first and second current mirrors connected to mirror current from said first and second differential pairs, respectively, into said third current source at said high impedance node, forming a voltage output at said node.

22. The merged amplifiers of claim 21, wherein said output current mirror is a Wilson current mirror.

23. The control system of claim 21, wherein said base complementor comprises:

a third current mirror connected to subtract its own base current, which equals the base current required for said first and second current mirrors, from the desired current produced by said third current source and to mirror the resultant current, and a bipolar transistor, having a current gain equal to the current gain of the transistors of the differential pairs, connected to obtain base current from the current mirrored by said third current mirror and to thereby subtract current equal to one half that of the first and second current sources divided by the current gain of the bipolar transistor.

24. A constant current/constant voltage battery charger, comprising:

a battery charging controller having an input terminal for connection to a voltage supply terminal, a charging output terminal for connection to a battery to thereby supply a controlled charging current to said battery, and a control input terminal for connection to a measurement and comparison system, said control input terminal providing feedback to said charging controller, and a measurement and comparison circuit including a pair of merged operational transconductance amplifiers, said measurement and comparison circuit connected to measure the voltage across a battery under charge and the charging current supplied to said battery, to compare those values to desired values and to produce a control signal based upon those measurements and comparisons and to provide said control signal to said control input terminal, said merged transconductance amplifiers comprising:

first and second bipolar differential pairs, the control terminals of said pairs providing differential inputs, one set of current conducting terminals of the first pair coupled through a first current source to a supply terminal, a corresponding set of current conducting terminals of the second differential pair coupled through a second current source to said supply terminal, the other set of current conducting terminals of the first and second pair coupled to another supply terminal, a pre-compensated current source, said pre-compensated current source comprising:

a third current source connected to produce a current equal to one half that of the first and second current sources, a base current complementor connected to produce a complementary base current which is equal to the complement of predetermined base currents and to combine the complementary base current with the current produced by the third current source, and an output current mirror connected to mirror the combined current produced by the base current complementor and to thereby form a pre-compensated output current, and first and second current mirrors connected to mirror current from said first and second differential pairs, respectively, into said third current source at a high impedance node, forming a voltage output at said node.

* * * * *